(12) United States Patent
Chakraborty et al.

(10) Patent No.: US 11,276,912 B2
(45) Date of Patent: Mar. 15, 2022

(54) MAGNETIC BALUN/TRANSFORMER WITH POST PROCESSING ADJUSTMENTS

(71) Applicant: International Business Machines Corporation, Armonk, NY (US)

(72) Inventors: Sudipto Chakraborty, Plano, TX (US); Rajiv Joshi, Yorktown Heights, NY (US); Steven J. Holmes, Ossining, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/135,451

(22) Filed: Dec. 28, 2020

(65) Prior Publication Data
US 2021/0151848 A1    May 20, 2021

Related U.S. Application Data

(63) Continuation of application No. 16/394,608, filed on Apr. 25, 2019, now Pat. No. 10,903,544.

(51) Int. Cl.
*H03H 7/42* (2006.01)
*H03H 5/00* (2006.01)
*H01P 5/10* (2006.01)

(52) U.S. Cl.
CPC .............. *H01P 5/10* (2013.01); *H03H 5/003* (2013.01)

(58) Field of Classification Search
CPC .............. H03H 7/42; H03H 5/00; H01P 5/10
See application file for complete search history.

(56) References Cited

U.S. PATENT DOCUMENTS

| 4,800,344 | A | 1/1989 | Graham |
| 8,248,840 | B2 | 8/2012 | Li et al. |
| 8,884,715 | B2 | 11/2014 | Mu |
| 2013/0106507 | A1 | 5/2013 | Signoff |
| 2015/0263682 | A1 | 9/2015 | Issakov |
| 2019/0013353 | A1 | 1/2019 | Lee et al. |

FOREIGN PATENT DOCUMENTS

WO    WO2018119153 A2    6/2018

OTHER PUBLICATIONS

List of IBM Patents or Patent Applications Treated as Related.

*Primary Examiner* — Dean O Takaoka
(74) *Attorney, Agent, or Firm* — Scully, Scott, Murphy & Presser, PC; Daniel P. Morris, Esq.

(57) ABSTRACT

A high input impedance magnetic balun/transformer having a phase balancing network (PBN) and method of operating. The balun is fully configurable and trimmable post fabrication using independently adjustable resistive and reactive parts by changing the resistance of a programmed transistor, e.g., NMOS. Parallel connected legs each having a field effect transistors (FETs) that make up NMOS device alter the impedance at the balun output terminals. The ground terminal of a secondary winding or coil at an unbalanced, single-ended side is connected to a phase balancing network. The phase balancing network includes at least two parallel legs, each leg having a resistive element in the form of a transistor device and at least one leg including a capacitive element. The transistor device at a leg can be operated in a linear region to trim the resistance and capacitances at the unbalanced side in order to achieve proper phase balancing and amplitude matching.

19 Claims, 11 Drawing Sheets

MAGNETIC BALUN/TRANSFORMER WITH POST PROCESSING ADJUSTMENTS

FIELD

The present application relates to inductive elements inclusive of transformers and baluns, and, in particular, to novel high impedance magnetic balun (e.g., balanced to unbalanced) and transformer elements for reducing power consumption in radio frequency (RF) and broadband circuits.

BACKGROUND

A balun is a type of linear signal transforming element that acts as an adaptor between devices that are configured for balanced, differential lines and devices that are configured for unbalanced, single-ended lines. Typically, a transformer having one or more primary and secondary coils or windings can be used to construct the balun having, e.g., a balanced input, where both input ports are isolated from ground to an unbalanced output where one output port is connected to ground. In radio frequency (RF) receiver/transmitter systems, a transformer balun is a multi-port component placed between a source and load when a differential, balanced RF functional block must connect to a single-ended, ground-referenced one.

Figure 1A:
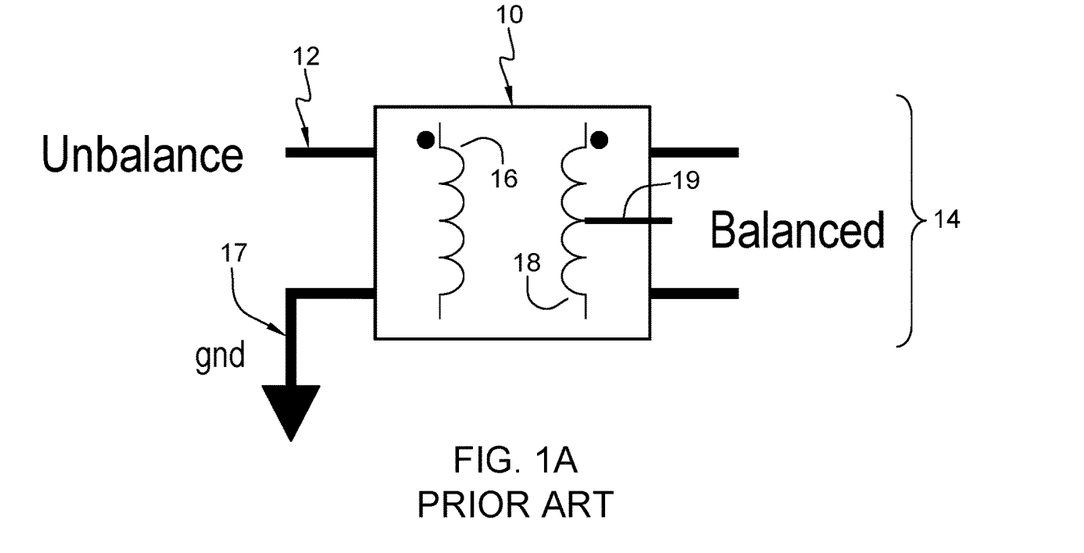
FIGS. 1A-1B depict a respective diagram of an integrated circuit depicting a conventional balun.

As shown in FIG. 1A, a balun 10 includes a transformer having a primary and secondary coil or windings 16, 18. Primary winding 16 connects to unbalanced side having a terminal 12 and ground terminal 17. Secondary winding 18 connects to balanced side having terminals 14. The balun receives an unbalanced, single-ended signal on an input line 12 with respect to AC ground 17 and converts it into balanced, differential signals on lines 14. The center tap terminal 19 is associated with the differential terminals 14 and represents an AC ground and is located at the structural symmetry point. This center tap terminal may be connected to supply/bias/ground potentials to force voltages or may be left open for sensing purposes.

Figure 1B:
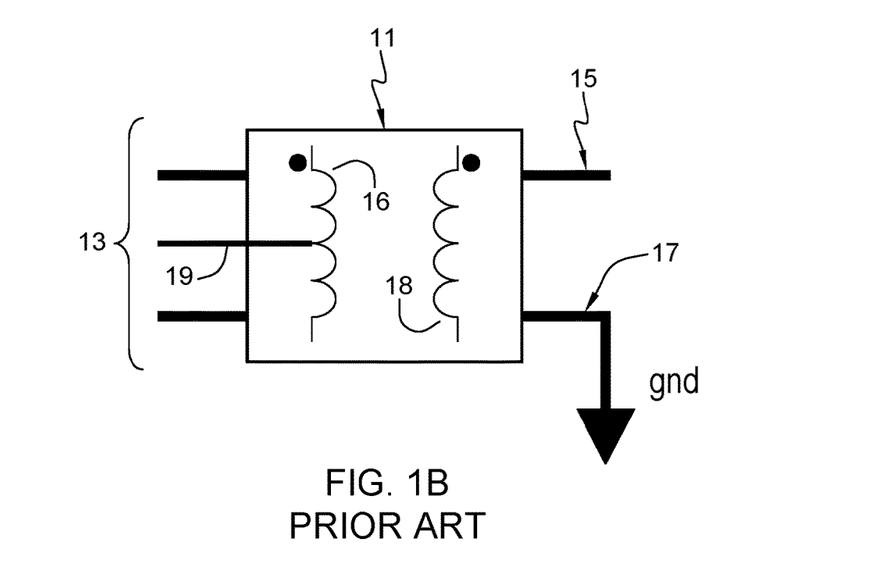

Alternatively, as shown in FIG. 1B, a balun 11 receives balanced, differential signals on input lines 13 and provides an unbalanced, single-ended output signal on output line 15 with respect to a common or ground of constant potential (e.g., 0 volts). The center tap terminal 19 is provided at the structure between the differential terminals. Balun circuits 10 and 11 may be realized on circuit boards, e.g., as surface mount components and circuits on a printed circuit boards, or realized as semiconductor components in semiconductor circuits (chips) or integrated circuits (ICs).

High impedance magnetic baluns (e.g., balanced to unbalanced) (with a large inductance L) are essential to reduce power consumption in RF circuits, and ground referenced baluns are essential for transmitter output (e.g., single pin output). Once fabricated, amplitude and phase imbalance, which are measures of how accurately the signal power and phase (e.g., 180° out-of-phase signals) are matched between the two balanced (differential) ports of the balun, cannot be corrected (trimmed).

In particular, phase balance (/match) is a measurement in degrees of the difference in phase between an inverted output from a non-inverted output of the balun. Baluns with a phase balance closer to 0° are higher performing baluns.

Amplitude balance (/match) is a measure of the match of the output power magnitude between the two balanced ports. An amplitude match closer to 0 dB is an indicator of a higher performing balun.

Prior art magnetic baluns of FIG. 1A, 1B are chiefly characterized as having a low secondary inductance, exhibits a fixed amplitude and phase imbalance, and are relatively narrowband.

Impedance of a resonance circuit constructed from an inductive element with inductance L and capacitance C is given by $Z=2\pi fLQ$, where f represents the center frequency of the resonator, L represents the inductance and Q is the loaded quality factor of the resonator, and is typically obtained as the parallel combination of the quality factors of inductive and capacitive elements.

SUMMARY

Aspects of the invention provide a balun/transformer structure with high impedance at resonance that can be trimmed for phase and amplitude balancing post-production and a related method.

In one aspect there is provided a high resonance impedance magnetic balun/transformer configurable to implement gain/phase adjustment post fabrication by trimming resistive and reactive elements.

In embodiments, the high input impedance magnetic balun/transformer is configurable to provide a ground referenced for single ended side.

In embodiments, the high input impedance magnetic balun/transformer is fully configurable and trimmable post fabrication using a resistance of a programmed MRAM or NMOS transistor device. In particular, field effect transistors (FETs) such as NMOS devices are operated in a linear region to trim the resistance and capacitances. Such devices are configured in parallel to each other, and used as a part of phase balancing network (PBN).

In embodiments, both sides of the high resonance impedance magnetic balun/transformer are fully configurable for independent adjustment of amplitude and phase imbalance.

In accordance with a first aspect of the invention, there is provided a magnetic balun comprising: first and second input terminal receiving differential signals from a signal source; first and second output terminals, a first output terminal providing a single-ended output signal based on the received differential signals; and a phase balancing circuit connected to the second output terminal, the phase balancing circuit comprising a parallel connection of resistance components and capacitor components connecting to a ground, each resistance components and capacitor component connected with respective switching element, the phase balancing circuit configurable to switch in a parallel configuration of resistance and capacitor elements to modify an impedance at the output terminals to achieve independent adjustment of a phase or amplitude at the single-ended output.

In accordance with a further aspect of the invention, there is provided a magnetic balun comprising: a first input terminal receiving a single-ended input signal from a signal source, the signal referenced to a ground terminal; first and second output terminals providing an output differential signal based on the received single-ended input signal; and a phase balancing circuit connected to a second input terminal, the phase balancing circuit comprising a parallel connection of resistance components and capacitor components connecting to a ground, each resistance components and capacitor component connected with respective switching element, the phase balancing circuit configurable to switch in a parallel configuration of resistance and capacitor elements to modify an impedance at the input terminals to achieve independent adjustment of a phase or amplitude at the differential signals output.

In accordance with a further aspect of the invention, there is provided a method of operating a magnetic balun in a radio frequency circuit, the balun having first and second input terminal receiving input signals from a signal source, and first and second output terminals, a first output terminal providing a single-ended output signal based on the received input signals, the balun comprising a primary winding or coil connecting the first and second input terminal for receiving the input signals, the method comprising: sensing, at a detecting circuit, a phase or amplitude imbalance of received input signals at the primary winding, the detecting circuit generating one or more control signals responsive to a detected phase or amplitude imbalance, and receiving, at a phase balancing network (PBN) circuit connected to the second output terminal, the generated one or more control signals, the phase balancing circuit comprising a parallel connection of resistance components and capacitor components connecting to a ground, each resistance components and capacitor component connected with a respective switching element, a switching element receiving the control signals to switch in a parallel configuration of resistance and/or capacitor elements to modify an impedance at the output terminals to achieve independent adjustment of a phase or amplitude at the single-ended output.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

Conventionally, a balun is used to convert balanced or differential signals into unbalanced or single-ended signals. Baluns have found increasing use in circuits for millimeter-wave, radio frequency (RF), and high-speed wired applications. The integration of baluns with circuit elements has led to a reduction in power consumption, input/output ports, size and cost of balun-equipped circuits. Moreover, baluns for such circuit integration are broadband and compact and have a low insertion loss and good return loss.

The embodiments of the apparatus and methods herein achieve high impedance magnetic balun/transformer for low power systems, and configurable to implement gain/phase adjustment post fabrication by trimming implemented using memory devices or transistor devices, e.g., field effect transistor (FET) or metal oxide semiconductor FET (MOSFET) devices or such transistor devices found in magnetic random access memory (MRAM) devices.

Figure 2A:
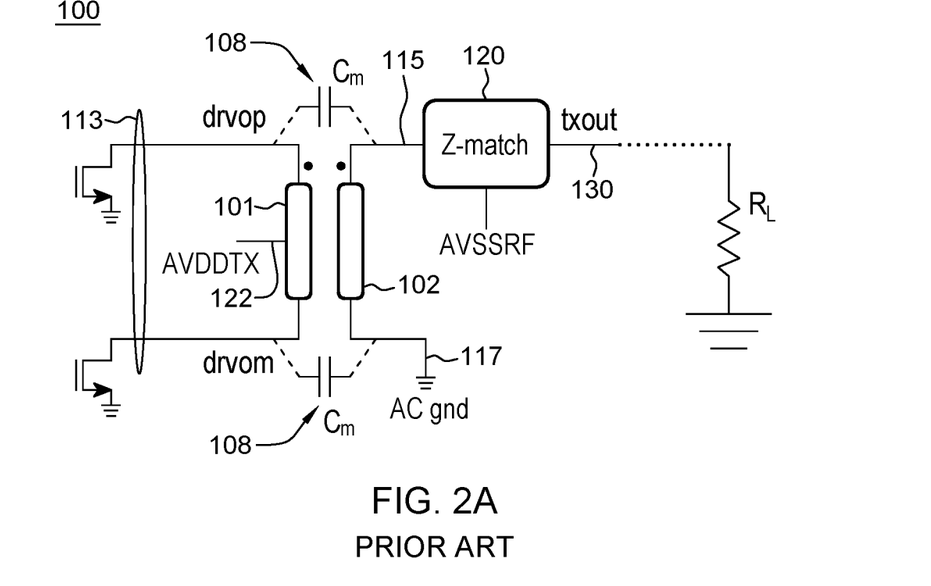
FIG. 2A is a circuit schematic depicting a conventional use of a balun configured in an RF receiver system architecture.

Turning now to FIG. 2A, there is depicted a more detailed view of a conventional balun 100 used in an RF transmitter system architecture for transmitter operations. The balun 100 includes a transformer comprising a core (e.g., magnetic), a primary inductor or coil 101 connected to a balanced input side and one or more secondary inductors or coils 102 connected to a single-ended, unbalanced side. The primary coil 101 receives electrical energy from a power source, e.g., as differential signals 113, and couples the energy to the secondary coil(s) 102 by virtue of changing magnetic field, wherein the energy appears as an electromagnetic field across the coil 102. If a load $R_L$ is connected to an output 115 of the secondary coil, the energy is transferred to the load with respect to a fixed ground 117. An impedance matching circuit or matching network (MN) 120 is provided at the single ended output 115 in order to ensure maximum power transfer to the connected load $R_L$.

Referring to FIG. 2A, as known, impedance matching circuits 120 connecting a load can include a variety of capacitance (C), inductance (L) and LC circuit configurations that will be dependent upon one or more of: a) Impedance transformation factor; b) whether the IC circuit application includes a Low pass, high pass, or bandpass type frequency response; and further c) component values and biasing. Such LC circuit configuration of a matching (maximum power transfer) network 120 may include passive filter circuit components, e.g., an inductance filter, a capacitive filter, low pass L-C filter designs, high-pass L-C filter designs, Pi-type LC low-pass filter designs and Pi-type LC high-pass filter designs. In an embodiment, components of the matching network 120 can be part of the inductor/transformer shown in FIG. 1. In a matching network, multiple cascaded sections may be used for wider bandwidth. In some circuit configurations, some of the components (e.g., two inductors) may be combined together in the same footprint and mutual coupling can be used. As further shown in FIG. 2A, is the provision of an analog supply voltage (VDD) 122 for transmitter (TX) operations using balun 100.

Figure 2B:
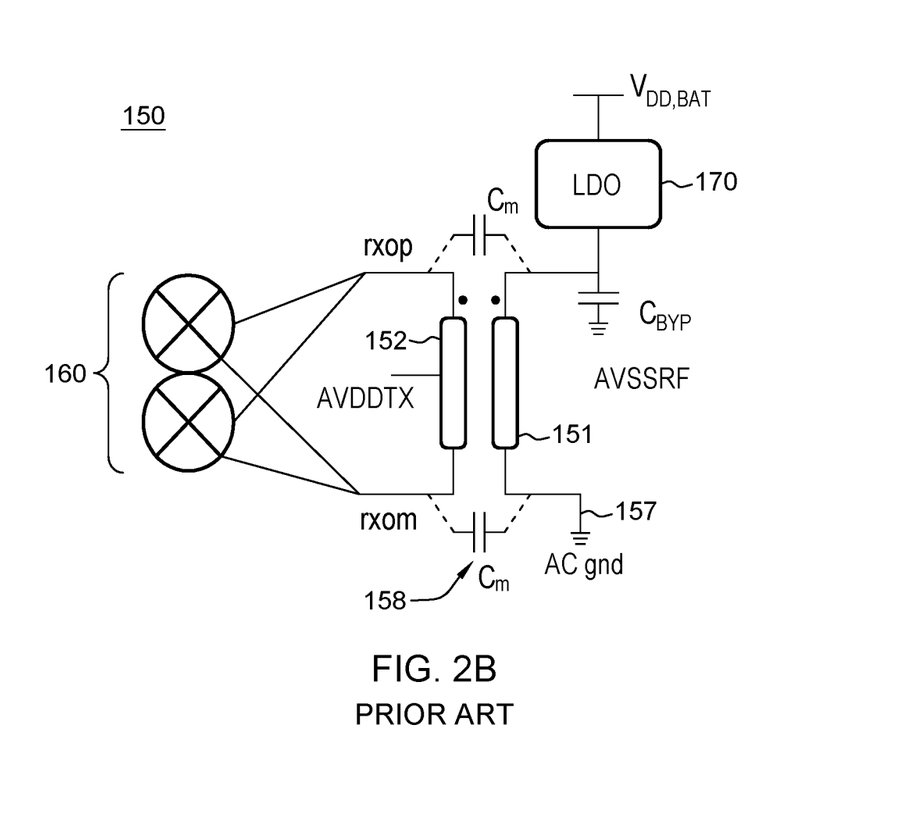
FIG. 2B is a circuit schematic depicting a conventional use of a balun configured in a RF transmitter system architecture.

FIG. 2B shows a detailed view of a conventional balun 150 used in RF receiver system architecture for receiver (RX) operations. The balun 150 includes a transformer comprising a core (e.g., magnetic), a primary inductor or coil 152 connected to an single-ended unbalanced input side and one or more secondary inductors or coils 152 connected to a balanced side for receipt at in-phase (I) and quadrature-phase (Q) mixers 160. As further shown, a voltage supply VDD is applied to a terminal on the balanced side of the balun 150 and includes a low-dropout or LDO DC voltage regulator 170 to provide a DC bias.

In the embodiments shown in both FIG. 2A and FIG. 2B primary coils 101, 152 can be of a first inductance value $L_1$, while secondary coils 102, 151 can be of a second inductance value $L_2$. When $L_1 \neq L_2$, balun device 100, 150 is configured as a transformer, however when $L_1 \approx L_2$, device 100 is configured as a Balun, however, in both configurations, there is caused an impedance transformation. In embodiments, the inductor or coil L2 can be on-chip or off-chip, e.g., one of the coils used in transformer may be implemented on chip while the others on package. For a low power system, the inductor values of $L_1$ and $L_2$ are relatively large, leading to large mutual capacitance 108 between the windings 101, 102 and capacitance 158 between the windings 151, 152. The large mutual capacitance 108, 158 causes signal imbalance both in terms of amplitude and phase. These imbalances lead to modal conversion, i.e., common mode to differential mode and differential mode to common mode.

In one aspect of the present invention, instead of providing a fixed low impedance connected at the common or ground terminals 117, 157 of FIG. 2A, FIG. 2B respectively, of an ideal value, e.g., 0 ohms, there is connected a configurable phase balancing network. It is understood that the ground 157 may be connected to a common system ground (not shown).

Figure 3:
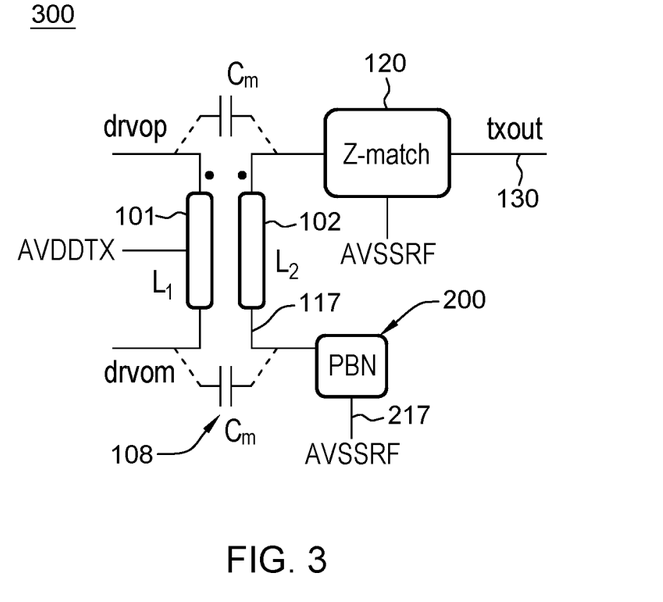
FIG. 3 shows a more detail circuit schematic of the balun/transformer circuit incorporating phase balancing trim network according to an embodiment of the invention.

FIG. 3 shows a high-impedance balun 300 according to an aspect of the invention, which is similar to the balun shown in FIG. 2A however, replaces the ground or fixed low impedance connection 117 to a phase balancing network (PBN) 200 tied to a reference voltage or ground 217. In an embodiment, PBN 200 represents a phase balancing network including components for trimming a balun impedance in receiver or transmitter designs in order to correct for phase and/or amplitude post-manufacturing. In embodiments, both sides of the balun can be adjusted to achieve independent amplitude and phase balance.

Figure 4:
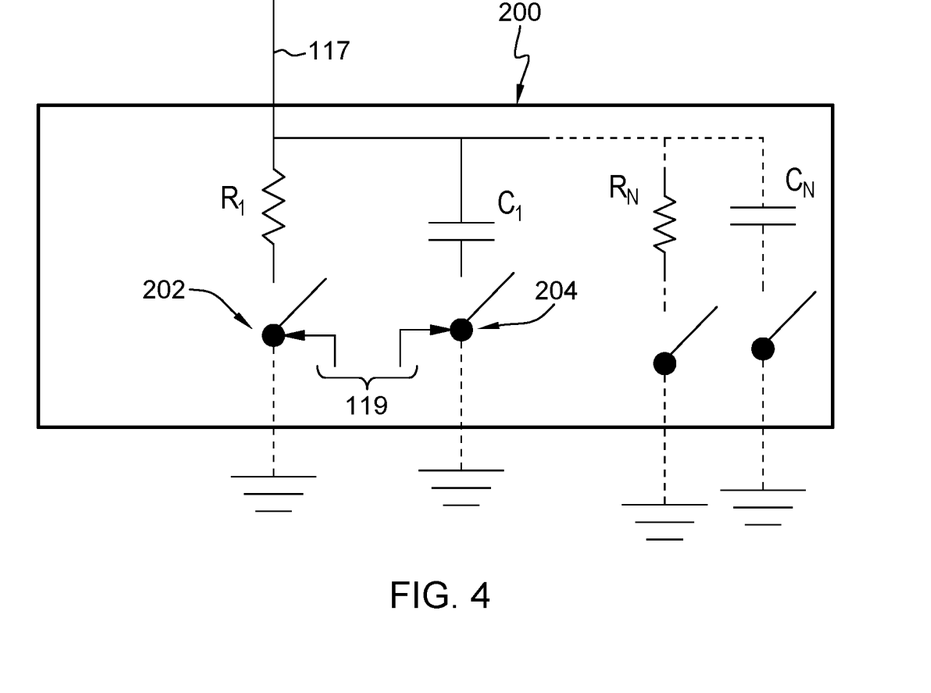
FIG. 4 shows a circuit schematic of a phase balancing trim network according to a first embodiment for use in the balun circuit of FIG. 3.
Figure 5:
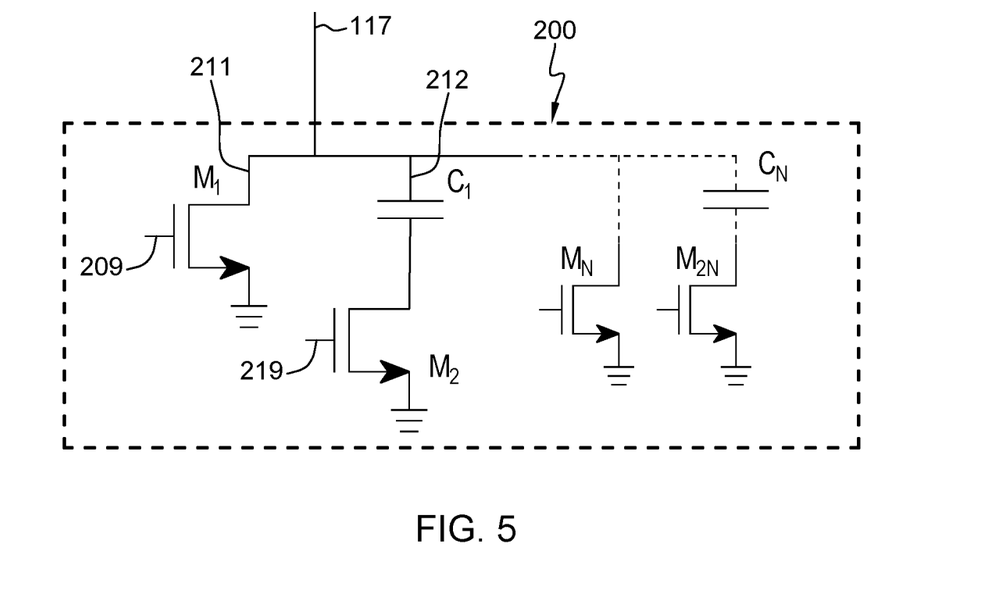
FIG. 5 shows a circuit schematic of a phase balancing trim network according to a second embodiment for use in the balun circuit of FIG. 3.

In embodiments, the phase balancing network shown in FIGS. 4, 5 include a programmable resistance and capacitance array that are connected in parallel. For a given trimming situation, N elements out of M elements of the array components can be selected such as by using an analog signal, e.g., a voltage, or digital codewords. Configuring the resistance legs in the PBN 200 controls the real part of the impedance, and configuring the capacitance legs in the PBN 200 controls the reactance part of the balun impedance.

FIG. 4 shows one non-limiting embodiment of a PBN 200 used to trim impedance of the Balun 100 of FIG. 3 according to an aspect of the invention. In the embodiment, the PBN 200 is a physical RC circuit configuration tied to ground in which the resistor (R) and capacitor (C) elements are configurable in parallel. In particular, PBN 200 includes a parallel connection of one or more legs, a first plurality of one or more legs having a resistance R element, e.g., elements $R_1, \ldots, R_N$ and a second plurality of one or more legs having a capacitive element, e.g., elements $C_1, \ldots, C_N$, each R and C element in a respective leg is enabled to be switched in or out of the network. For example parallel leg having resistor R is switched in circuit via respective a switch element 202 and leg having capacitor C is switched in via respective switch element, 204. As further shown, PBN network 200 include signal lines 119 for providing control signals from a control or processing unit for controlling opening/closing of switch elements 202, 204.

In an embodiment, the parallel configured RC circuit configurations of PBN 200 can be implemented using a configuration of transistor devices. FIG. 5 shows a further, non-limiting embodiment of a PBN used to trim impedance of the Balun 100 of FIG. 3. As shown in FIG. 5, PBN 200 includes a parallel connection of one or more legs, a first plurality of one or more legs having a resistance R element embodied as a switching transistor (FET), e.g., MOS or NMOS element $M_1, \ldots, M_N$, and a second plurality of one or more legs, each leg having a capacitive element and a series connected separately controllable switching transistor (FET), e.g., series elements $C_1$ $M_2$ . . . , $C_N$ $M_{2N}$. In embodiments, each switch device $M_1$, . . . $M_N$ and $M_2, \ldots, M_{2N}$ is a transistor field effect devices (FETs) or metal-oxide gate FETs (MOSFETs) or a magnetic RAM (MRAM) or NMOS transistor configured in circuit as semiconductor IC devices formed on a semiconductor substrate.

In an embodiment, FET transistor $M_1$ on leg 211 includes a drain terminal connected to one terminal of the capacitor element $C_1$ in a parallel leg connection, a source terminal connected to ground, and a gate terminal connected to a signal source for providing open/close switch control signal 209 to control transistor $M_1$. In an embodiment, transistor $M_1$ can be controlled by control signal 209 at a gate terminal to provide a controllable or variable resistance of leg 211. Transistor $M_2$ on leg 212 includes a drain terminal connected to the other terminal of the capacitor element $C_1$ in the parallel leg, a source terminal connected to ground, and a gate terminal connected to a signal source for providing open/close switch control signal 219 to control a resistive state of transistor $M_2$.

Generally, in PBN circuit 200, the MOS transistors $M_1$ and $M_2$ are controlled to be configured in one or more modes of operation including: (a) cut-off, (b) ON and operating as a nonlinear resistor, (c) Operating in the saturation region as a voltage controlled current source, by consuming current, or (d) weak inversion. In a specific case, when a transistor $M_1$ and/or $M_2$ is cut-off, it does not conduct any current when the gate-source voltage (VGS) is less than the threshold voltage (VTH). This condition is given by VGS<VTH.

In embodiments, transistor element $M_1$ and/or $M_2$ operate in a linear region when VGS>VTH, and VDS<VGS, and in this case, the resistance (also called the ON resistance) is given by $r_{ON}=1/[k'*(W/L)*(VGS-VTH)]$. A minimum resistance is obtained when VGS−VTH is maximized, which happens for VGS=VDD. This is also called as voltage variable resistance configuration.

Impedance trimming is performed by automatically detecting, using a detection circuit, transformer imbalance (i.e., amplitude and phase imbalance), and applying logic to determine how to correct the imbalance and generate a corresponding correcting signal (e.g., an analog voltage changing the gate source voltage, or the threshold voltage) or the digital codeword, e.g., that selects M out of N MOSFET transistors in a particular configuration, e.g., biased in a linear region of operation.

Figure 6:
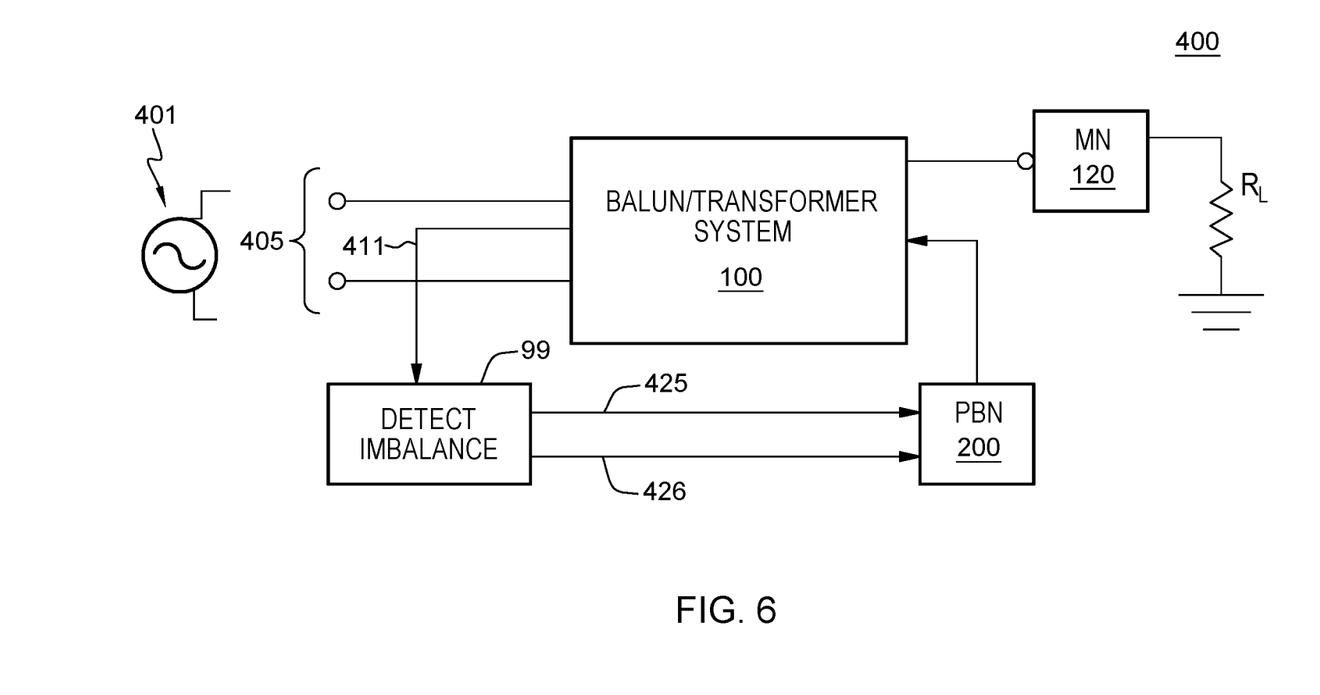
FIG. 6 depicts a detector circuit for automatically providing post-manufacture phase or amplitude trimming of a balun/transformer according to a first embodiment.
Figure 7:
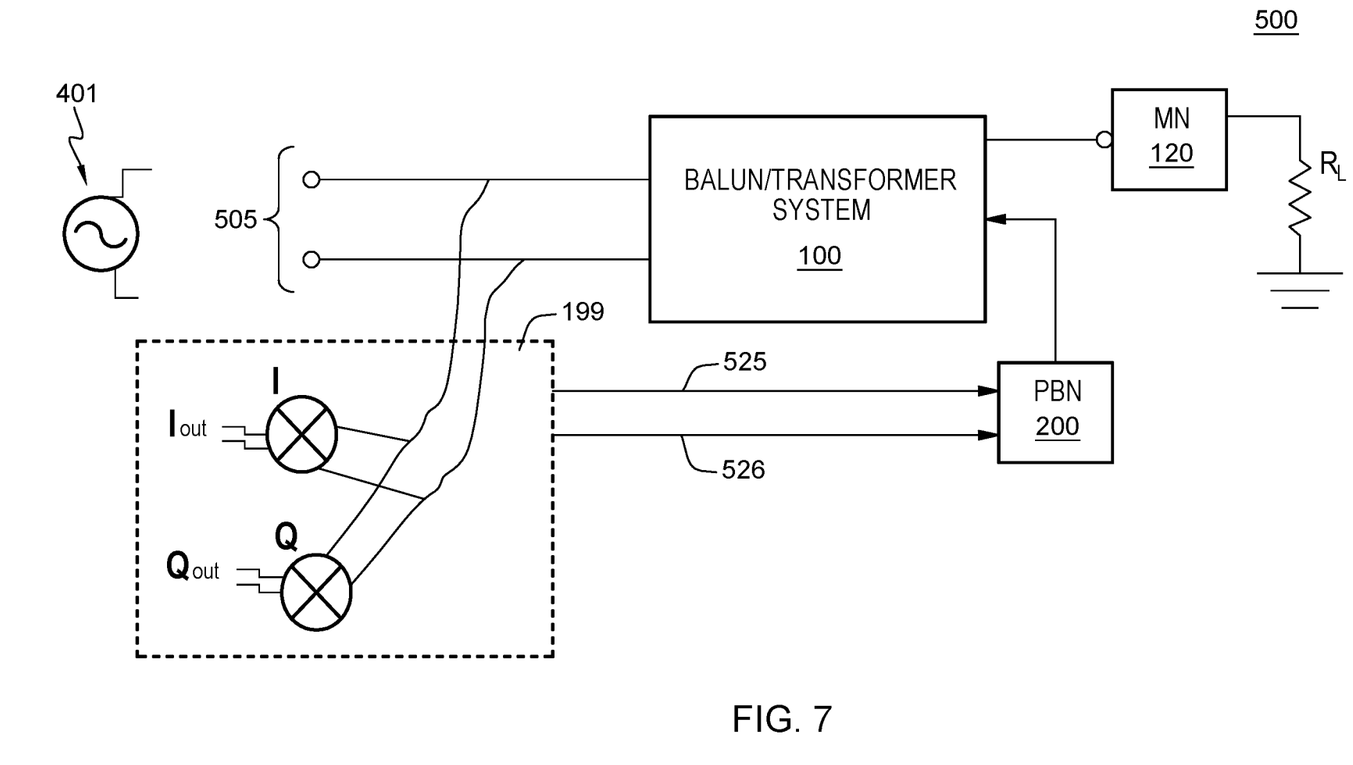
FIG. 7 depicts a detector circuit in a radio receiver configured for automatically providing post-manufacture phase or amplitude trimming of a balun/transformer according to a second embodiment.

In particular, the detection circuits of FIGS. 6 and 7 are circuits configured to trim the impedance at the differential ports of the secondary windings, to correct phase and amplitude imbalances.

Referring to FIG. 6, there is depicted an overall balun system architecture 400 employing PBN 200 and controlling circuitry for use in trimming impedance at the output terminals of the Balun. In the first embodiment, a signal source 401 that may be in the PCB or IC, provide (e.g., inject) an input tone signal at differential inputs 405 to the Balun 100, e.g., the inputs connecting the primary coil. A center tap 411 at the primary coil of the Balun/transformer can sense a voltage amplitude of common mode signal present on the center tap and provide that sensed signal at a hardware processor or logic controller 99 configured with logic to detect an amount of imbalance of the sensed common mode signal at the primary coil of the Balun 100. In response to the amount of detected imbalance, the processor 99 is configured to generate a code signal 425 for controlling a switching element at the PBN 200 to control a resistance of the PBN network at the other terminal of the unbalanced side of Balun. Such a signal may comprise a resistance code word $R_{code}$, e.g., a voltage or bits. Additionally, in response to the amount of detected imbalance, the processor 99 generates a code signal 426 for controlling a switching element at the PBN 200 to control a reactance (e.g., capacitance) of the PBN network of Balun. Such a signal may comprise a capacitance code word $C_{code}$, e.g., a voltage or a pulse resistance code signal and capacitance codes signals may be individually controlled to control switching elements 202, 204 in the PBN embodiment of FIG. 4, and/or control switching of one or more parallel elements $M_1, \ldots, M_{2N}$ in the PBN embodiment of FIG. 5. By continuously monitoring the center tap signal 411, there may be conducted real-time detection of common-mode signal imbalances for use in generating the control signals for post-production trimming of the impedance of the Balun.

Referring to FIG. 7, there is depicted an overall balun system architecture 500 employing PBN 200 and controlling circuitry 199 inherent in a radio system receiver. The controlling circuitry 199 is used for use in trimming impedance at the output terminals of the Balun. In the second embodiment, in an implementation employing a radio receiver, typically the receiver is capable of generating and injecting a tone (differential) signals at the input terminals of the Balun 100 and make the measurements without using a center tap common mode imbalance detecting element. For example, typical radio systems provide an in phase (I) and quadrature (Q) phase signals. Hence, calibration can be implemented by using the resources of the existing RF system receiver itself. In FIG. 7, there is shown an RF receiver component configured to provide in phase (I) and quadrature (Q) signals that can be sensed responsive to injection of a tone signal at the Balun 100 input terminals 505, e.g., connecting the primary coil. Any imbalance occurring between the I_out and Q_out is immediately sensed using detecting circuitry at the receiver. By observing the Iout and Qout signals, any imbalance can be detected and suitable codewords 525, 526, generated which may be a pattern of 0, 1 that can be used to trim resistance and or capacitance of the parallel legs. By continuously monitoring the Iout and Qout signals, there may be conducted real-time control for post-production trimming of the impedance of the balun.

Figure 8:
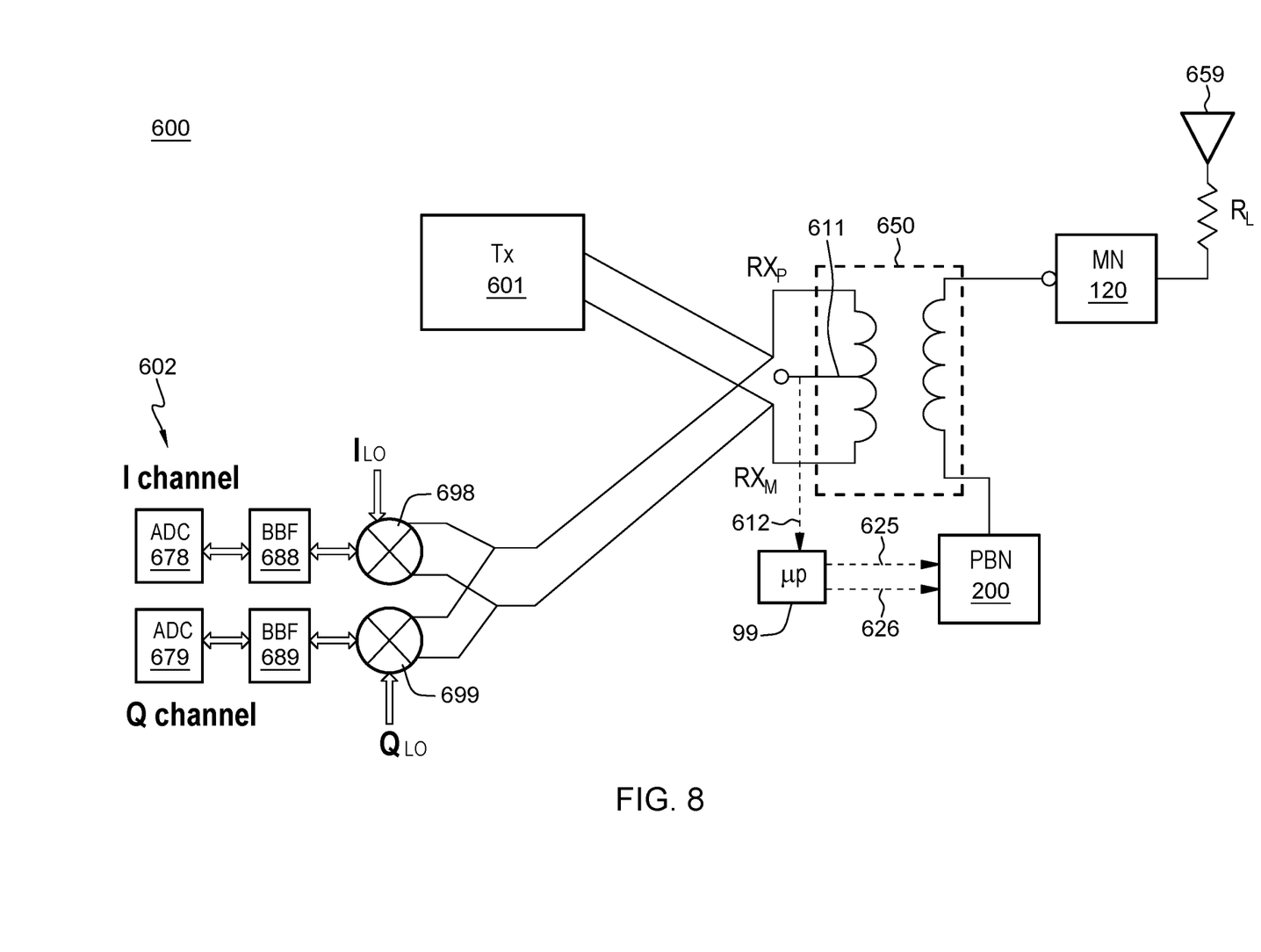
FIG. 8 depicts a transceiver system architecture employing balun/transformer and post-manufacture phase and amplitude balancing network (PBN) circuitry including a detector circuit configured for automatically controlling balun impedance trim responsive to detecting a common mode signal.

FIG. 8 depicts a configuration of a radio frequency system 600 including a receiver (RX) and transmitter (TX) sharing a balun/transformer 650 having a connected matching network 120 and post-fabrication impedance trim balancing network 200 according to the embodiments of the invention. As shown in the system 600 of FIG. 8, both the RX and TX systems are connected on the same side, i.e., by direct coupling. Alternatively, both the RX and TX systems can be connected on the same side by separate couplings. In the embodiment of FIG. 8, the differential side of balun/transformer 650 includes differential terminals with a center tap terminal 611 shown. A first set of terminals at the differential side carry received differential signal components $TX_P$ and $TX_M$ at directly from transmitter (TX) component 601 which may be an application specific integrated circuit (ASIC) for transmission. A second set of terminals at the differential side carry received $RX_P$ and $RX_M$ signals for direct input connection to receiver (RX) components 602 including respective In-phase (I) and Quadrature phase (Q) RF mixer circuits 698, 699. The respective signals $RX_P$, $TX_P$, $RX_M$ and $TX_M$ denote the differential signals carried including "p" for plus (0 degree) and "m" for minus (180 degrees) of the differential signal. RF mixer circuits 698, 699 are included in a down-conversion stage providing I and Q component outputs to baseband filters (BBF) 688, 689 which feed filtered I and Q signal components to respective analog-to-digital (ADC) circuitry 678, 679 for eventual processing by a digital signal processor (not shown). In receiver operations, balun 650 is used to convert the unbalanced signal received from antenna 659 into a balanced signal. The mixers 698, 699 convert the RF signal into complex baseband signals having I and Q components and employ a quadrature synthesizer (not shown) to generate respective two RF signals: $I_{LO}$ and $Q_{LO}$, with a constant 90° phase offset between them for down-converting the received RF signals.

Figure 10:
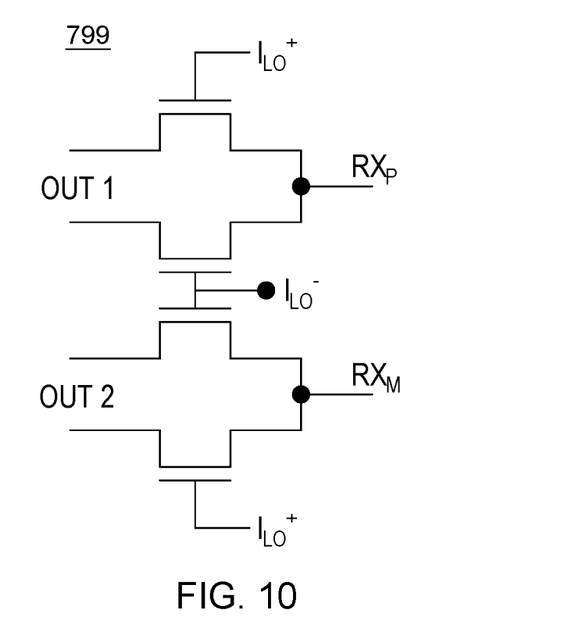
FIG. 10 depicts a configuration of an RF electronic mixer circuit for use in the I-channel down-conversion processing at the receiver system of FIG. 8.

FIG. 10 depicts a configuration of an RF electronic mixer circuit 799 for use in the I-channel down-conversion processing at the receiver system 602 of FIG. 8. In an embodiment, the I-channel mixer circuit 799 is a transistor-based double-balanced active mixer as the LO and RF ports are being driven differentially receives the $RX_P$ and $RX_M$ signals and down converts them producing respective differential output signals Out1 and Out2 using the local oscillator (not shown) that are applied in a differential quadrature fashion where the $I_{LO}^+$ and $I_{LO}^-$ represent 0 degree and 180 degree phases. Similarly, at the Q-channel mixer, the $RX_P$ and $RX_M$ signals are down converted using the $Q_{LO}^+$ and $Q_{LO}^-$ which represent respective 90 degree and 270 degree phases.

As further shown in the embodiment of FIG. 8, the post-fabrication impedance trim detector 99 receives the common mode signal 612 directly from the center tap 611 at the differential (balanced) side of the balun 650 in order to generate signals 625, 626 for respectively adjusting the resistive and reactive impedance components to maximize power transfer and achieve balancing and matching of amplitude and phase to enhance performance.

Figure 8A:
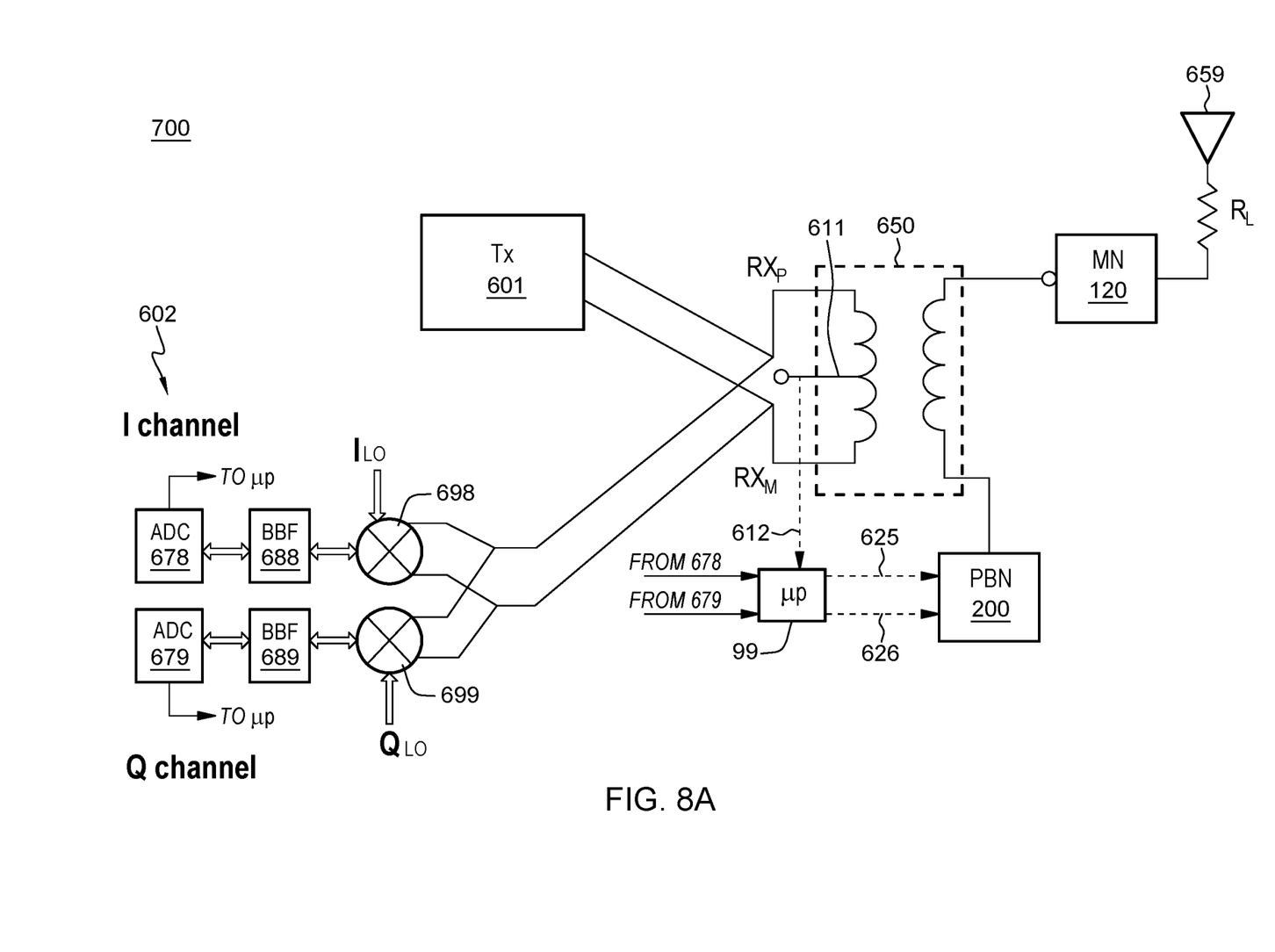
FIG. 8A depicts a modified transceiver system architecture employing balun/transformer and post-manufacture phase and amplitude balancing network (PBN) circuitry including a detector circuit configured for automatically controlling balun impedance trim responsive to detected differential signals.

In a further embodiment of radio frequency system 700 depicted in FIG. 8A, corresponding to the radio frequency system 600 of FIG. 8, the post-fabrication impedance trim detector 99 performs detection using the differential signals (sum and difference) only from the balun. In the embodiment of FIG. 8A, processor (detector) 99 receives I and Q differential signal values directly from ADC circuits 678 and 679 and computes the sum and difference of these detected differential signals from the balun 650, generate signals 625, 626 for adjusting the respective resistive and reactive impedance components to maximize power transfer and achieve balancing and matching of amplitude and phase to enhance performance. An alternate detection scheme for detecting common mode perturbation is also obtained by averaging the two outputs from the I channel (678) or the Q channel (679).

Figure 9:
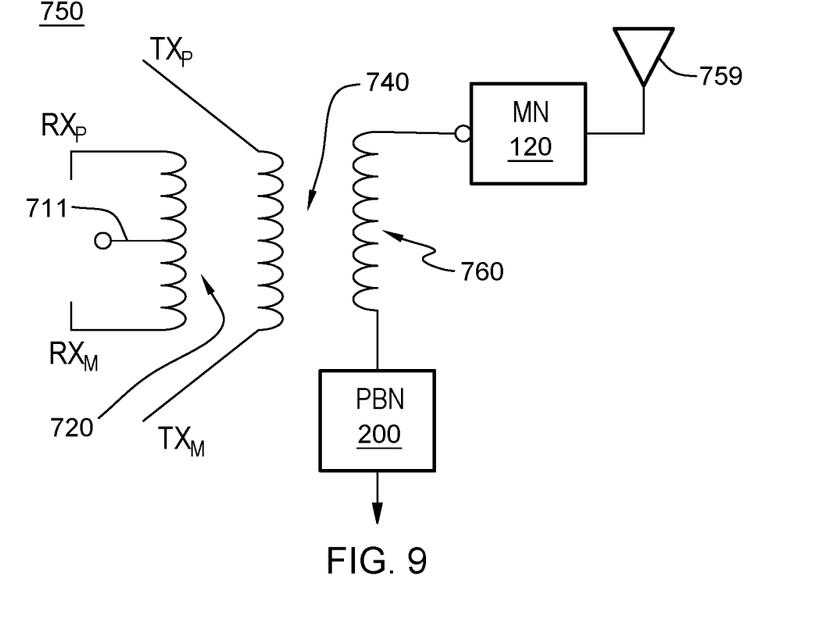
FIG. 9 depicts an alternative configuration of a balun/transformer that is shared with radio frequency receiver (RX) and transmitter (TX) components as in the embodiment of FIGS. 8, 8A.

FIG. 9 depicts an alternative configuration of a balun/transformer 750 that is shared with radio frequency receiver (RX) and transmitter (TX) components as in the embodiment of FIGS. 8, 8A. However, in the embodiment of FIG. 9, balun 750 includes separate coil windings for magnetic coupling to TX system 601 and RX system 602. For example, primary windings 720 couple RF signals $RX_P$ and $RX_M$ at the differential side for input to and processing at connected receiver (RX) system 602 as in FIG. 8. A further primary winding structure 740 receives RF signals $TX_P$ and $TX_M$ from TX system 601 and couples these signals to secondary winding at 760 at the balun for output at the antenna 759. As before, $RX_P$, $TX_P$, $RX_M$ and $TX_M$ denote the differential signals carried including "p" for plus (0 degree) and "m" for minus (180 degrees) of the differential signal. As shown, the balun/transformer 750 of FIG. 9 includes on the unbalanced side, the connected matching network 120 and post-trim phase balancing network 200 for post-fabrication impedance trim according to the embodiments of the invention.

In either of the embodiments of FIGS. 8, 8A and 9, the post-fabrication balun impedance trim concepts described herein can be used for multiple coupled coils (i.e., more than two coils).

Referring back to FIGS. 4-6, 8 and 8A, the processor performs method steps for detecting and generating code for correcting any detected impedance mismatch, e.g., based on common mode perturbation.

Figure 11:
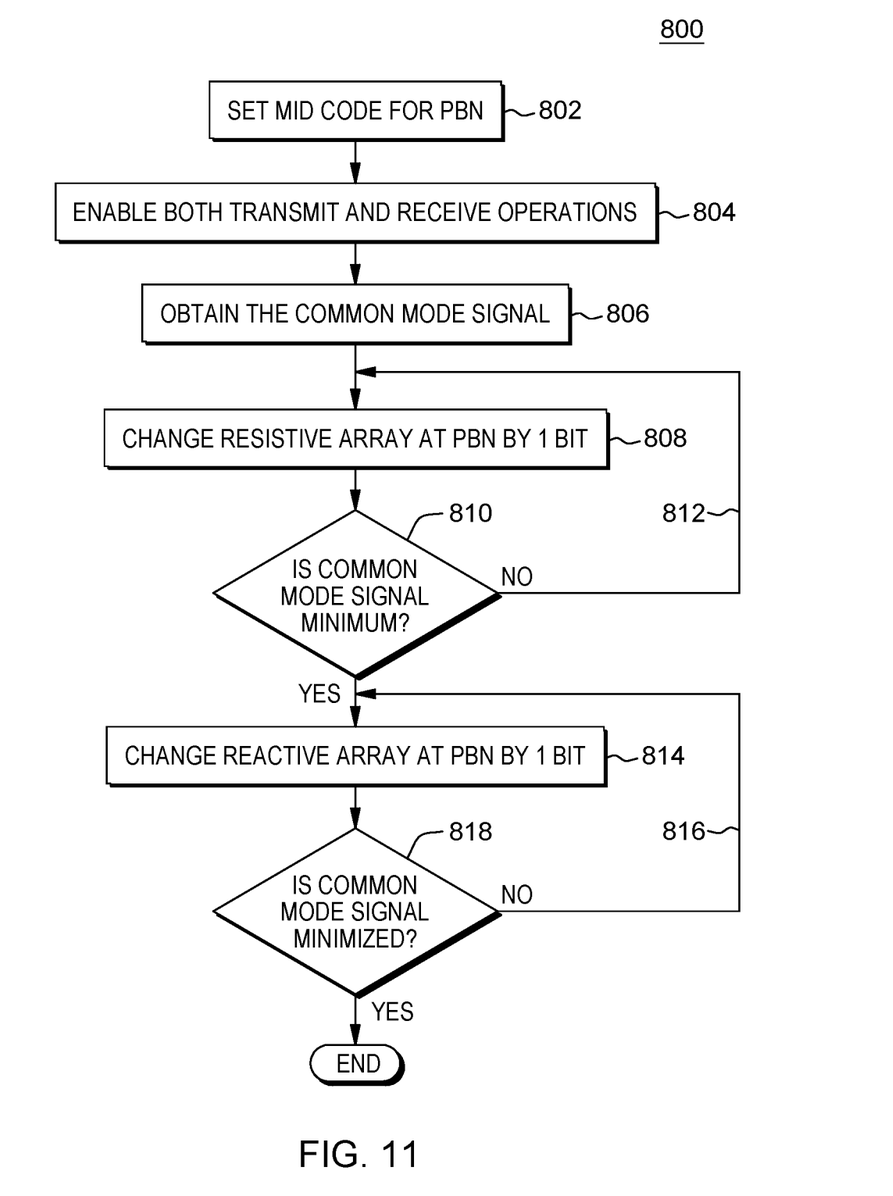
FIG. 11 depicts a method performed by the processor to detect an impedance mismatch (imbalance) at the balun/transformer and automatically provides a phase balancing correction at the PBN based on common mode perturbation.

FIG. 11 depicts a first method 800 performed by the processor 99 to detect an impedance mismatch (imbalance) at the balun/transformer 750 and automatically provide an amplitude and phase balancing correction at the PBN 200 based on common mode perturbation after system manufacture. In particular FIG. 11 shows a detection method that uses detection of common mode signals only, or a minimum of common mode signal as the differential signal is not available. At a first step 802, the processor sets the PBN 200 configuration by providing a code word, e.g., a mid code, to place the PBN in a default or initial impedance state. For example, a digital code word used to trim the resistive part of the PBN is an N-bit code, and the digital code used to trim the capacitive part is a P-bit code, these codes will span between all 0's to all 1's. The mid code is a binary code word that represents a value half way between the minimum and the maximum. For example, for a 4 bit binary code word, 0000 is the minimum code and 1111 is the maximum code, so the mid code could be either 0111 or 1000, either one can be used as the starting point. This strategy using mid code is used to "reduce" search time and used for successive approximation algorithms to obtain the "near exact" code with spending the least amount of time.

Then at 804, both TX transmit and RX receive systems are enabled for respective operation. At 806, there is obtained the common mode signal at the center tap 611. Based on this detected common mode signal, there is determined at 808 a need to change the resistive array at the PBN, e.g., by 1 bit. This may correspond to switching in a variable resistive component, e.g., NMOS transistor, at the PBN. Then, depending upon the sensed sum and difference signals (i.e., common mode or differential signal), a decision is made at 810 as to whether the sensed common mode signal is minimized (e.g., equals 0). If, at 810, it is determined that the common mode signal is not minimized (e.g., does not equal 0), then the process returns at 812 to step 808 in order to generate a further code word to further vary the resistive impedance component at the PBN 200. The process steps 808, 810, and 812 repeat until the common mode signal is minimized. When, at 810, it is determined that the common mode signal is minimized, i.e., equals 0, then the process proceeds to step 814 in order to change the reactive array at the PBN, e.g., by 1 bit. Then, depending upon the sensed common mode signal at the center tap, a decision is made at 818 as to whether the common mode perturbation (i.e., sensed common mode signal) is minimized, e.g., equals 0. If, at 818, it is determined that the common mode signal is not minimized, i.e., does not equal 0, then the process returns at 816 to step 814 in order to generate a further code word to further vary the reactive impedance component at the PBN 200. The process steps 814, 816, and 818 repeat until the common mode signal is minimized (amplitude and phase balanced) at which such time the balun impedance matching process ends.

Referring back to FIGS. 4-5, 7, 8 and 8A, the processor performs method steps for generating code for correcting any detected impedance imbalance/mismatch, e.g., using detected differential signals (sum and difference).

For example, during operation post-manufacture, due to any detected signal imbalance, there are obtained two single-ended signals at the differential terminals:

1) $\alpha(1+\delta)\cos(w_{rf}t+\phi)$ and
2) $-\alpha \cos(w_{rf}t)$ where δ represents the amplitude imbalance and y represents the phase imbalance.

For differential mode, the differential mode signal is given by a quantity: out1−out2 which results in a output differential signal mode quantity according to equation 1):

$$[\alpha(1+\delta)\cos \phi + \alpha]\cos(w_{rf}t) - \alpha(1+\delta)\sin(w_{rf}t)\sin \phi \qquad 1)$$

The common mode signal is given by a quantity out1+out2 which results in output common mode signal quantity according to equation 2):

$$[\alpha(1+\delta)\cos \phi - \alpha]\cos(w_{rf}t) - \alpha(1+\delta)\sin(w_{rf}t)\sin \phi \qquad 2)$$

By detecting when δ=0 and when δ=0 at the processor 99, there is no detected imbalance and no modification of the PBN necessary.

That is, for balancing in a differential mode detection, there would be detected a signal $2\alpha \cos(w_{rf}t)$; and for common mode=0.

Thus, two mechanisms can be implemented for detecting and correcting phase/amplitude mismatch or imbalance: 1) by minimizing the common mode perturbation by adding two signals and sensing the common mode of the signals as depicted in FIG. 11; and 2) by maximizing a ratio of differential to common mode signals, the "ratio" to be maximized being a "mode enhancement ratio" or a "common mode rejection ratio".

Figure 11A:
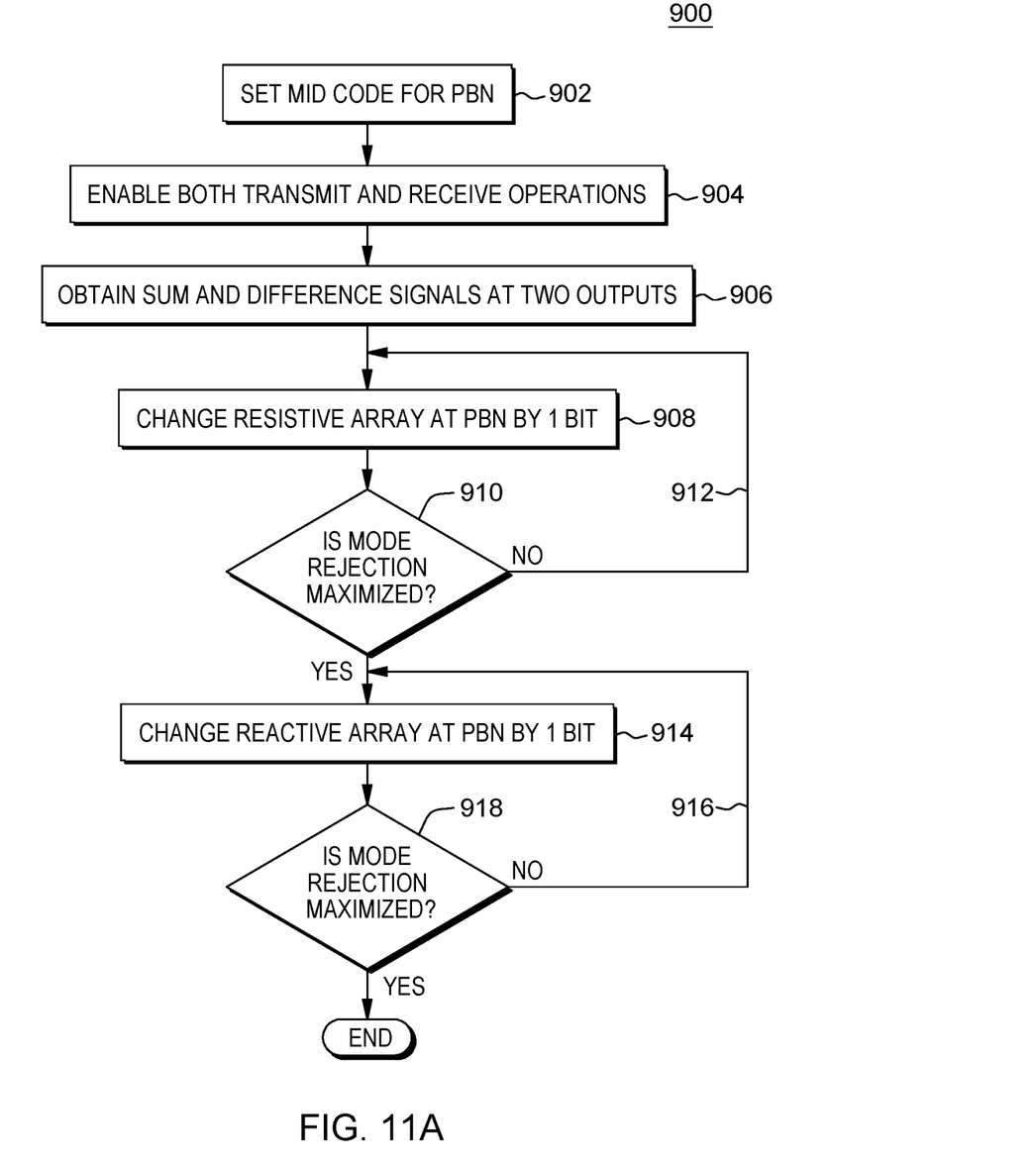
FIG. 11A depicts a method performed by the processor to detect an impedance mismatch (imbalance) at the balun/transformer and automatically provides a phase balancing correction at the PBN based on differential signals.

In the second method 900 depicted in FIG. 11A the processor 99 detects an impedance mismatch (imbalance) at the balun/transformer 750 and automatically provides an amplitude and phase balancing correction by adjusting resistive and reactive components at the PBN 200 after system manufacture. At a first step 902, the processor sets the PBN 200 configuration by providing a code word, e.g., the mid code, to place the PBN in a default or initial impedance state. Then at 904, both TX transmit and RX receive systems are enabled for respective operation. At 906, there is obtained sum and difference signals at the two outputs configurations according to equations 1) and 2) above. Based on these signals, there is determined at 908 a need to change the resistive array at the PBN, e.g., by 1 bit. This may correspond to switching in a variable resistive component, e.g., NMOS transistor, at the PBN. Then, depending upon the sensed sum and difference signals (i.e., from differential signals), a decision is made at 910 as to whether the common mode rejection ratio (CMRR) is maximized, i.e., whether the "ratio" of differential to common mode signal is maximized. If, at 910, it is determined that the CMRR is not maximized, then the process returns at 912 to step 908 in order to generate a further code word to further vary the resistive impedance component at the PBN 200. The process steps 908, 910, and 912 repeat until CMRR is maximized. When, at 910, it is determined that the CMRR is maximized, then the process proceeds to step 914 in order to change the reactive array at the PBN, e.g., by 1 bit. Then, depending upon the sensed sum and difference signals (i.e., common mode or differential signal), a decision is made at 918 as to whether the common mode rejection ratio (CMRR) is maximized, i.e., whether the "ratio" of differential to common mode signal is maximized. If, at 918, it is determined that the CMRR is not maximized, then the process returns at 816 to step 814 in order to generate a further code word to further vary the reactive impedance component at the PBN 200. The process steps 914, 916, and 918 repeat until CMRR is maximized at which such time the balun impedance matching process ends.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A radio frequency system comprising:
    a magnetic balun comprising:
        a first coil having first and second input terminals receiving a tone signal injected from a signal source;
        a second coil having a first output terminal; and
        a mixer circuit for obtaining an in-phase (I) and quadrature-phase (Q) signals that can be sensed responsive to said injected tone signal at the first and second input terminals;
    a phase balancing circuit connected to the first output terminal, the phase balancing circuit comprising a parallel connection of resistance components and capacitor components connecting to a ground, each resistance component and capacitor component of a respective leg connected to a respective switching element, said phase balancing circuit configurable to switch in a parallel configuration of resistance and capacitor elements to modify an impedance at said output terminal to achieve independent adjustment of a phase or amplitude at said balun; and
    a detector circuit for detecting a phase or amplitude imbalance between the in-phase (I) and the quadrature-phase (Q) signals provided in response to received tone signal at said first and second input terminals, the detector circuit responsive to a detected imbalance for generating one or more control signals for receipt at said switching elements of said phase balancing circuit for controlling said switching elements in said phase balancing circuit to switch in a parallel configuration of resistance and/or capacitor elements for correcting a detected imbalance.

2. The radio frequency system of claim 1, wherein the magnetic balun input terminals define a balanced port and the first output terminal is an unbalanced port.

3. The radio frequency system of claim 2, wherein the phase balancing circuit comprises one or more parallel connected legs, a leg having a respective resistor element connecting a switch device, or a capacitor element connecting a switch device.

4. The radio frequency system of claim 2, wherein the phase balancing circuit comprises one or more parallel connected legs, a leg having a transistor device configurable to provide a variable resistance, or a leg having a capacitor element connecting a transistor device, the transistor device configurable to provide a variable resistance.

5. The radio frequency system of claim 4, wherein the transistor device at any parallel leg is selected from the group comprising: a field effect transistor (FET), metal oxide semiconductor FET (MOSFET), a negative channel MOSFET (NMOS).

6. The radio frequency system of claim 2, further comprising:
    an impedance matching circuit connecting the second output terminal providing a single-ended output to a load, said impedance matching circuit comprising a configuration of components to ensure minimum power loss at said single-ended output.

7. The radio frequency system of claim 1, wherein said balun comprises a transformer wherein said first coil is a primary winding connecting said first and second input terminal for receiving said injected tone signal.

8. The radio frequency system of claim 4, wherein a control signal is generated to control a transistor device at a parallel connected leg to operate either in a cut-off state, or in an on-state operating as a nonlinear resistor.

9. The radio frequency system of claim 7, wherein said injected tone signal comprises differential signals, said detector circuit receiving data representing the differential signals and computing a common mode rejection ratio value based on a computed sum and difference of the differential signals, the detector circuit generating one or more control signals for receipt at said switches of said phase balancing circuit for controlling said switches in said phase balancing circuit to switch in a parallel configuration of resistance and/or capacitance elements responsive to a common mode rejection ratio.

10. A communication system comprising:
    a magnetic balun having input terminals of a balanced side and output terminals of an unbalanced side;
    a receiver (RX) circuit for receiving communication signals;
    a transmitter (TX) circuit for transmitting communication signals, said RX circuit and TX circuit directly connecting input terminals of the balun on the balanced side, said TX circuit having a signal source for injecting a differential signals into said first and second input terminals;
    a mixer circuit for obtaining an in-phase (I) and quadrature-phase (Q) signals that can be sensed responsive to said injected differential signals at the first and second input terminals;

a phase balancing circuit connected to an output terminal, the phase balancing circuit comprising a parallel connection of resistance components and capacitor components connecting to a ground, each resistance component and capacitor component of a respective leg connected to a respective switching element, said phase balancing circuit configurable to switch in a parallel configuration of resistance and capacitor elements to modify an impedance at said output terminals to achieve independent adjustment of a phase or amplitude at said single-ended output; and a detector circuit for detecting a phase or amplitude imbalance between in-phase (I) and quadrature phase (Q) signals provided in response to received differential signals at said first and second input terminals, the detector circuit responsive to a detected imbalance for generating one or more control signals for receipt at said switching elements of said phase balancing circuit for controlling said switching elements in said phase balancing circuit to switch in a parallel configuration of resistance and/or capacitor elements.

11. The communication system as claimed in claim 10, wherein said tone signal comprises differential signals, said magnetic balun input terminals comprising a set of differential terminals for receiving said differential signal components from said transmitter (TX) circuit for transmission thereof; and said magnetic balun comprising a second set of differential terminals at the differential side carry receiving differential signals for direct input connection to said receiver (RX) circuit.

12. The communication system as claimed in claim 11, wherein said mixer circuit comprises an In-phase (I) mixer circuit and Quadrature phase (Q) mixer circuit for obtaining respective said in-phase (I) and quadrature-phase (Q) signals.

13. The communication system as claimed in claim 12, further comprising an antenna receiving communication signals, said magnetic balun converting an unbalanced signal received from antenna into a balanced signal.

14. The communication system as claimed in claim 12, wherein said balun balanced side further comprises a center tap terminal, said detector circuit further receiving a common mode signal from a center tap terminal directly from the center tap at the balanced side of the balun and responsive to said common mode signal at said center tap generating further control signals for receipt at said switching elements of said phase balancing circuit for adjusting a resistive impedance and reactive impedance component to maximize power transfer and achieve balancing and matching of amplitude and phase.

15. The communication system as claimed in claim 12, said balun includes separate coil windings for magnetic coupling to TX circuit and RX circuit a first separate coil winding comprising a primary winding coupling differential RF signals at the balanced side for input to said connected receiver (RX) circuit, and a further primary winding coupling received differential RF signals from the TX circuit and couples these differential signals to a secondary winding at the balun for output at the antenna.

16. A method of operating a magnetic balun in a radio frequency circuit, said balun having first and second input terminal receiving input signals from a signal source, and first and second output terminals, a first output terminal providing a single-ended output signal based on said received input differential signals, said balun comprising a primary winding or coil connecting said first and second input terminal, said method comprising:

injecting a tone signal comprising differential signals into said first and second input terminals at said primary winding;

mixing said injected tone signal at said first and second terminals with respective local oscillator signals to obtain a respective in-phase (I) signal and quadrature-phase (Q) signal;

sensing, using the detecting circuit, a phase or amplitude imbalance between said in-phase I and Quadrature-phase Q signals at said primary winding, the detecting circuit generating one or more control signals responsive to a detected phase or amplitude imbalance, receiving, at a phase balancing circuit connected to said second output terminal, said generated one or more control signals, the phase balancing circuit comprising a parallel connection of resistance components and capacitor components connecting to a ground, each resistance components and capacitor component connected with a respective switching element, a switching element receiving said control signals to switch in a parallel configuration of resistance and/or capacitor elements to modify an impedance at said output terminals to achieve independent adjustment of a phase or amplitude at said single-ended output.

17. The method of claim 16, wherein responsive to a detected imbalance, generating a digital code word signal associated with modifying a resistance part of a balun input impedance and a digital code word signal associated with a reactance part of the balun input impedance.

18. The method of claim 17, wherein said balun balanced side further comprises a center tap terminal, said detector circuit further receiving a common mode signal from a center tap terminal directly from the center tap at the balanced side of the balun and responsive to said common mode signal at said center tap generating further control signals for receipt at said switching elements of said phase balancing circuit, said method further comprising:

generating an initial digital code word signal to place the phase balancing network into an initial impedance state, said initial digital code word representing a tuning of an impedance state half way between a minimum and maximum impedance state.

19. The method of claim 18, further comprising:

running a successive approximation method to iteratively receive said common mode signal from the center tap terminal and adjust said phase balancing circuit from said initial digital code word to obtain a digital code word for optimizing the resistance and reactance parts of the balun input impedance in a least minimum amount of time.

* * * * *